United States Patent [19]

Piepers

[11] Patent Number: 4,493,757
[45] Date of Patent: Jan. 15, 1985

[54] DEVICE FOR APPLYING BLOT-SHAPED COVERINGS BY ELECTRO-PLATING

[75] Inventor: Harry C. Piepers, Eindhoven, Netherlands

[73] Assignee: Galentan, A.G., Zug, Switzerland

[21] Appl. No.: 353,151

[22] Filed: Mar. 1, 1982

[30] Foreign Application Priority Data

Mar. 7, 1981 [NL] Netherlands .................... 8101106

[51] Int. Cl.³ ............................................ C25D 17/06
[52] U.S. Cl. .................................. 204/206; 204/202; 204/224 R
[58] Field of Search ............. 204/15, 202, 206, 224 R

[56] References Cited

U.S. PATENT DOCUMENTS

| 3,746,630 | 7/1973 | Kosowsky et al. | 204/206 |
| 3,819,502 | 6/1974 | Meuldijk et al. | 204/206 |
| 4,003,805 | 1/1977 | Schaer et al. | 204/27 |
| 4,090,928 | 5/1978 | Pantiga et al. | 204/15 |
| 4,132,617 | 1/1979 | Noz | 204/206 |
| 4,155,815 | 5/1979 | Francis et al. | 204/15 |
| 4,264,416 | 4/1981 | Noz | 204/15 |

FOREIGN PATENT DOCUMENTS

| 0055130 | 6/1982 | European Pat. Off. | 204/224 R |
| 52-50936 | 4/1977 | Japan | 204/224 R |
| 582014 | 11/1946 | United Kingdom | 204/202 |

Primary Examiner—Howard S. Williams
Assistant Examiner—T. L. Williams

[57] ABSTRACT

A device for applying blot-shaped coverings to metal or metallized tapes by electro-plating, comprising a guide member along which a metal and/or metallized tape can be guided and an endless masking member co-operating with the tape and the guide member and having passages, the shapes of which match the desired blot-shaped coverings, whereby the masking member is formed by independent segments, each of which has at least one passage, sealing means being arranged between the segments the structure of said means being such that while maintaining the sealing relationship between the segments they allow a movement of the segments relative to one another in the direction of length of the masking member.

15 Claims, 12 Drawing Figures

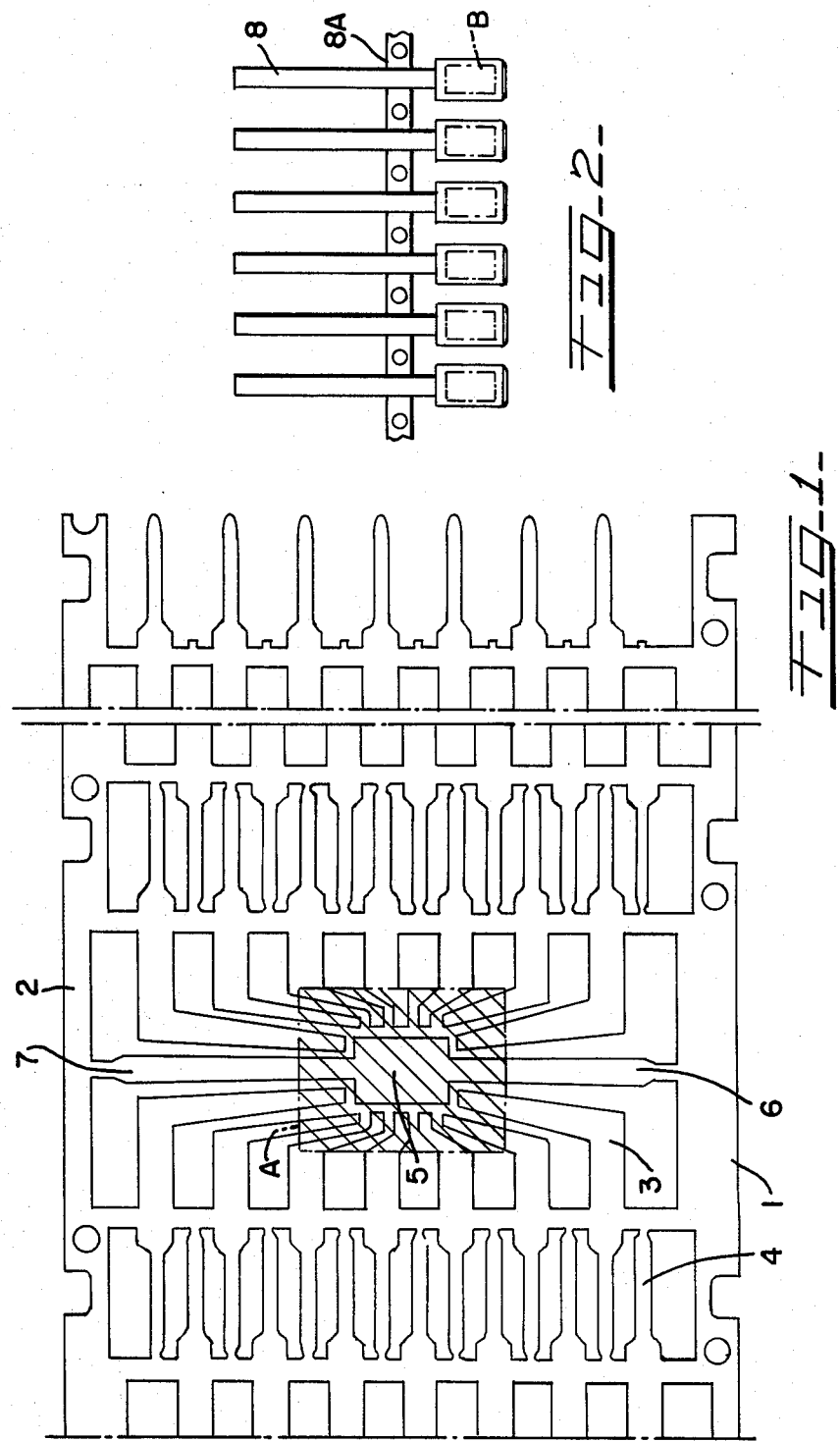

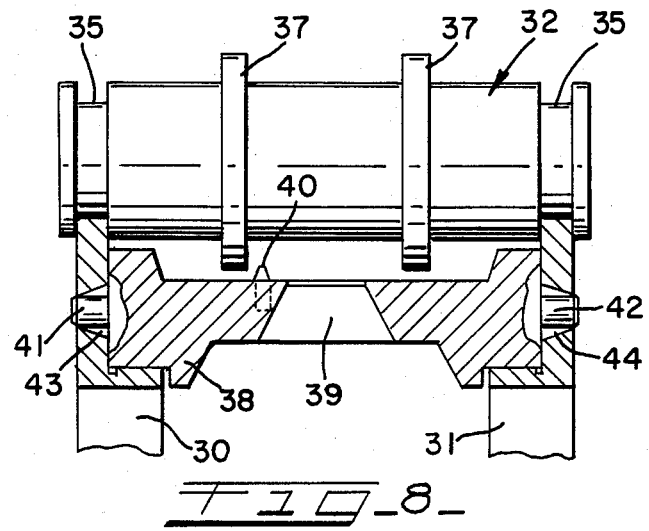
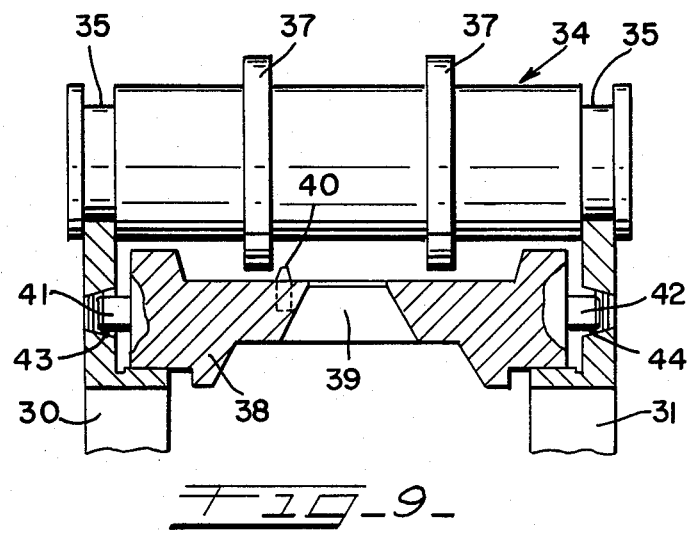

DEVICE FOR APPLYING BLOT-SHAPED COVERINGS BY ELECTRO-PLATING

The invention relates to a device for applying blot-shaped coverings by electro-plating to metal and/or metallized tapes comprising a guide member, along which a metal and/or metallized tape can be guided, and an endless masking member co-operating with the tape and the guide member and having passages, the shapes of which match that of the desired blot-shaped coverings.

Devices of the kind set forth are particularly used for locally providing large numbers of products employed in the electronic industry with a covering of a given metal, which is usually more precious than the metal of the tape. Such coverings are, for example, required for preparing a product for a subsequent process, for example, in the case of semiconductors or for providing a product with a surface coating, which is conducive to the operation of the product as an electronic component, for example, a contact pin. For applying the desired coverings the objects to be treated are frequently arranged in the form of a tape, which is subsequently passed through an appropriate device for applying the desired coverings. Despite the fact that frequently only a local covering of the tape was required the whole surface of the tape, often even both the front and the back of the tape was coated with the metal to be deposited, which involved not only important waste of the coating metal but also due to the high consumption of the coating material a proportionally high increase in price of the finished product, particularly because the required coating frequently consists of a noble metal such as gold, silver or palladium. In order to mitigate this disadvantage it has become the practice to apply the coating material concerned only to the relevant parts of the material to be covered.

For the manufacture, for example, of printed circuits it is known to provide the components to be worked with the aid of photographic or printing techniques with non-conductive masks so that only the surfaces to be coated are left free. Then by an electro-plating process the free surfaces are covered with the coating material, after which the mask having become redundant is removed. However, such a method is too circuitous and time-consuming to provide local coatings on large numbers of tape-shaped, metal products, whilst the correct operation of the resultant products may be doubtful due to problems caused by residues of the removed mask, this method having furthermore the disadvantage of the consumption of large amounts of resist material, which has an adverse effect on the cost price of the product.

From U.S. Pat. No. 4,090,928 there is known a method of applying coatings in which a tape to be treated is arranged between two rectilinear parts of a masking device. One of said parts has a plurality of openings, the shapes of which match that of the coatings to be applied, whereas the other part is closed. Opposite each opening a fluid spray is arranged to serve as an anode and the device is furthermore provided with channels for evacuating the fluid sprayed against the tape clamped in the masking device by the sprays. When the tape clamped in the device has been sprayed sufficiently long to obtain the desired thickness of the metal coating, the device is opened, after which the tape is displaced over a given distance in its direction of length. Subsequently the tape is again clamped tight in the device in order to spray a next part of the tape with the aid of the fluid sprays.

It will be obvious that due to the intermittent operation of this device the blot-shaped coverings cannot be applied in continuous operation to the tape, since the application of the coverings has to be interrupted every time for displacing the tape. In practice it has been found that less than half the production time is effectively used for applying metal coverings to the tape-shaped product. A further, important disadvantage of this known device resides in the fact that great variations occur in the thickness of the simultaneously applied, blot-shaped patterns, since the thickness and the quality of the coating intimately depend on the fluid spray and it is found in practice that the thicknesses of various simultaneously applied, blot-shaped coverings may exhibit variations approximately amounting to one quarter of the thickness of the coating applied. In order to ensure an adequate value of the thickness of the coating a large amount of excess material has to be applied, which brings about heavy consumption of the coating material and requires more time for applying the coating, which again involves disadvantages.

Dutch patent application No. 7316244 discloses a device comprising a wheel arranged in an electrolyte containing holder, in which during operation the metal tape to be provided with blot-shaped coverings is passed along part of the periphery of said wheel. Together with said metal tape an endless masking belt of non-conductive, elastic material is passed along the wheel. This masking belt covers the metal tape on the side remote from the wheel and openings are made in the masking belt to match the shape of the coverings to be provided on the metal tape, said openings being, as a matter of course, arranged as far as possible at the distance matching the desired interval between the blot-shaped coverings. The holder furthermore comprises a spray pipe arranged concentrically with the rotary axis of the wheel for spraying, during operation, electrolyte against the parts of the metal tape left free by the masking belt. When using such a device electroplating can be continuously effected during the passage of the tape through the device, whilst by regular refreshment of the electrolyte a constant quality of the product can be obtained. Even if locally a nozzle of the spray pipe were clogged, the uniformity of the resultant product will not be adversely affected so that by using this device great reliability of operation is ensured. With regard to the ever higher requirements of preciseness of location and shape of the blot-like coverings, also in order to gain maximum saving of the expensive coating material, the use of such a device may, however, in some cases give rise to problems. For example, the elastic masking belt will not be sufficiently resistant to deformation to ensure a correct location of the blot-shaped metal coating on the metal or metallized tape when such high requirements have to be met. Moreover, due to differences of expansion coefficients of the material of the elastic belt and of the metal or metallized tape to be coated problems may be involved in maintaining the correct location of the masking belt with respect to the metal tape, since the work is frequently performed at temperatures considerably exceeding room temperature.

From Dutch patent application No. 7109404 is furthermore known a device comprising a wheel having an apertured outer periphery. The size and location of these apertures are to the desired, blot-shaped coatings to be applied to a tape and during operation the tape has to be passed around the wheel in a manner such that the surfaces of the tape to be covered are positioned opposite the apertures in the outer periphery of the wheel. In the wheel is furthermore arranged a spraying body with the aid of which pressurized electrolyte can be sprayed through the apertures against the relevant parts of the metal tape. It is endeavoured to maintain the metal tape in the correct position with respect to the wheel of synthetic resin with the aid of indexing pins on the wheel and co-operating with lugs or indexing holes in the tape. This device also operates satisfactorily, but in particular if it is desired to use larger wheel diameters for example, as may be desired to work complicated, fragile products, problems may be involved in obtaining correct positioning of the tape with respect to the openings in the periphery of the wheel. These problems are caused by (a) tolerances of the manufacture of the products united in a tape,
(b) tolerances in the manufacture of the wheel,
(c) unequal expansions due to unequal temperatures and/or unequal expansion coefficients of the metal tape and of the wheel.
(d) deformations due to mechanical load of the metal tape and/or the wheel.

For example, a length of tape of 9.3 m under treatment may exhibit as a result of an abrupt temperature variation $\Delta T = 50°$ K. a deviation of the position of a blot-shaped coating, measured in the direction of length of the tape, of $1.10^{-3}$ m, at least when the peripheral part of the wheel is made of perspex and the metal tape of nickel iron. In the manufacture of the metal tape tolerances of $2.10^{-4}$ m may occur over a length of 0.3 m. It has, however, to be possible to balance out such a deviation caused in the manufacture of the metal tape in the device applying the blot-shaped coating. In practice, in order to obtain final products of sufficient quality tolerances in the location of the blot-shaped coatings of only $1.10^{-4}$ m are allowed. In the known devices comprising masking members this is only possible when the tape is exposed to the treatment only over a length of about 0.3 m.

Nevertheless in order to obtain adequate thickness of the coating layer the rate of movement of the tape is limited.

The invention has for its object to provide a device of the kind set forth by which the disadvantages inherent to the known devices can be avoided.

According to the invention this can be activated in that the masking member is formed by independent segments, each of which has at least one passage, whilst between the segments sealing means are arranged so that, whilst maintaining the sealing relationship between the segments they allow a relative movement of the segments in the direction of length of the masking member.

By using the construction embodying the invention each segment can settle independently of the other segments so that a precise location of a segment and of the opposite part of the tape relative to one another can be maintained the electro-plating process, which results in a very accurate disposition of the desired, blot-shaped coverings.

The invention will be described more fully hereinafter with reference to the accompanying Figures.

FIG. 1 shows a first embodiment of a product that can be worked with the aid of a device embodying the invention.

FIG. 2 shows a second embodiment of a product that can be worked in a device in accordance with the invention.

Figure 3:
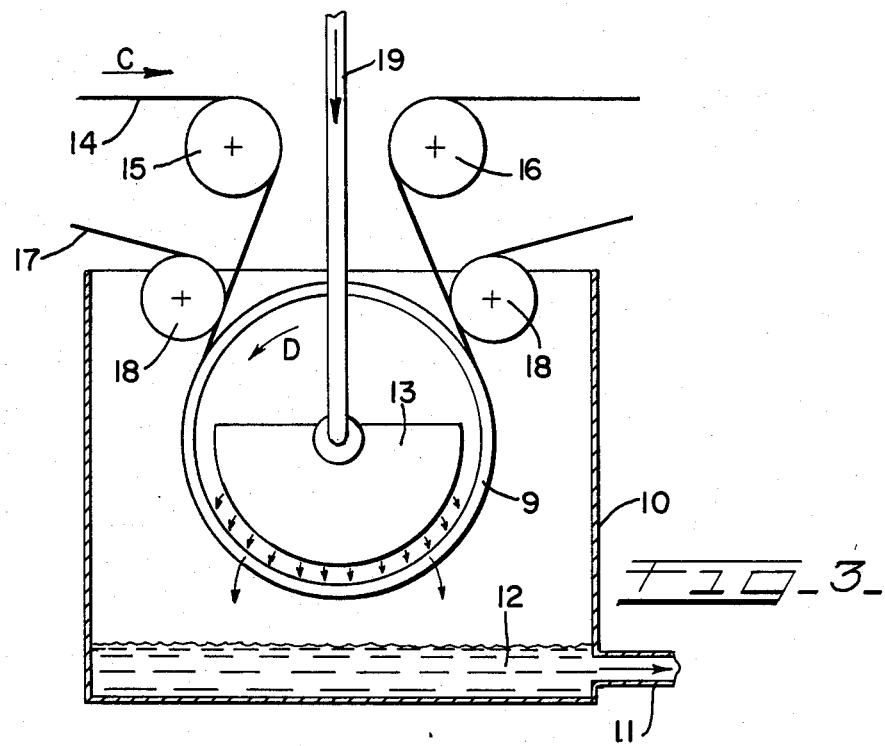

FIG. 3 schematically shows an embodiment of a device in accordance with the invention.

Figure 4:
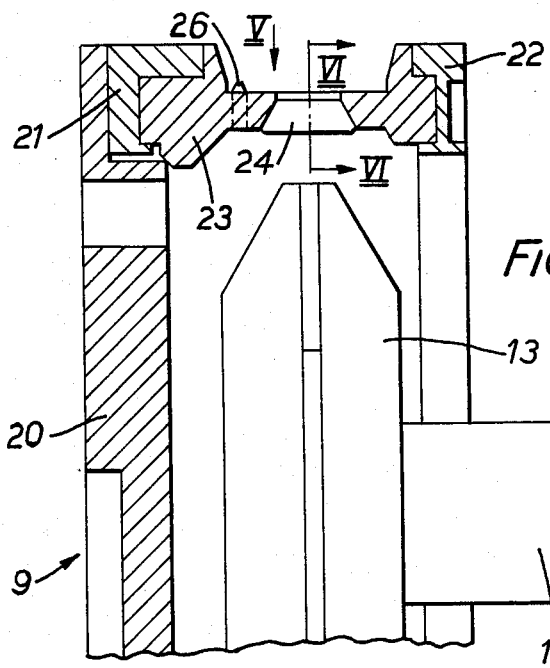

FIG. 4 is an enlarged, schematic sectional view of a wheel used in the device shown in FIG. 3.

Figure 5:
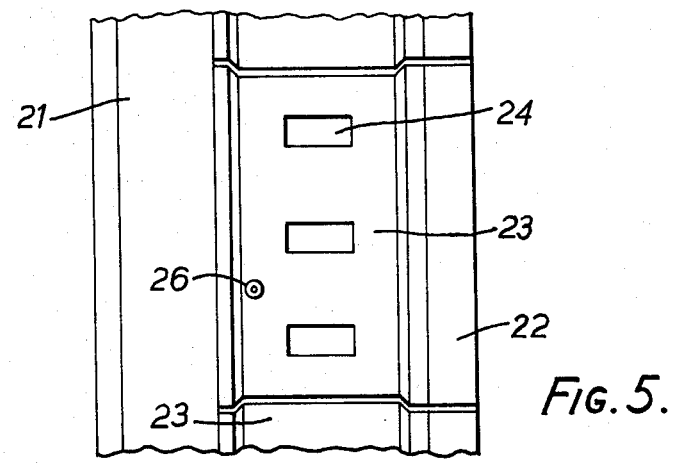

FIG. 5 is an elevational view of part of the wheel shown in FIG. 4 taken in the direction of the arrow V in FIG. 4.

Figure 6:
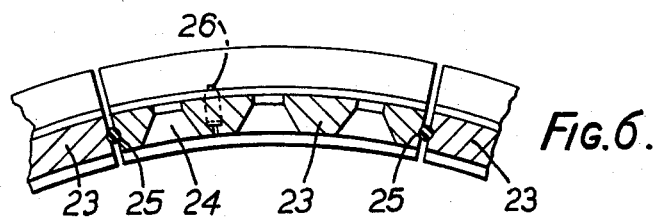

FIG. 6 is a sectional view of part of FIG. 4 taken on the line VI—VI in FIG. 4.

Figure 7:
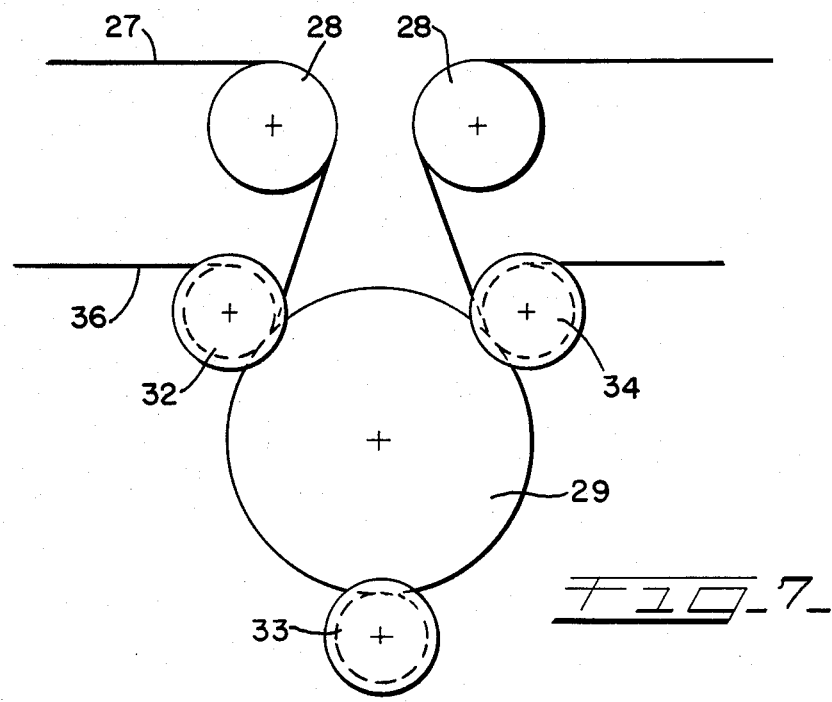

FIG. 7 schematically shows a second embodiment of a device in accordance with the invention.

FIG. 8 is an enlarged sectional view of part of a wheel employed in the device shown in FIG. 7.

FIG. 9 is a sectional view of the wheel of the device of FIG. 7, taken at a different point than the sectional view of FIG. 8.

Figure 10:
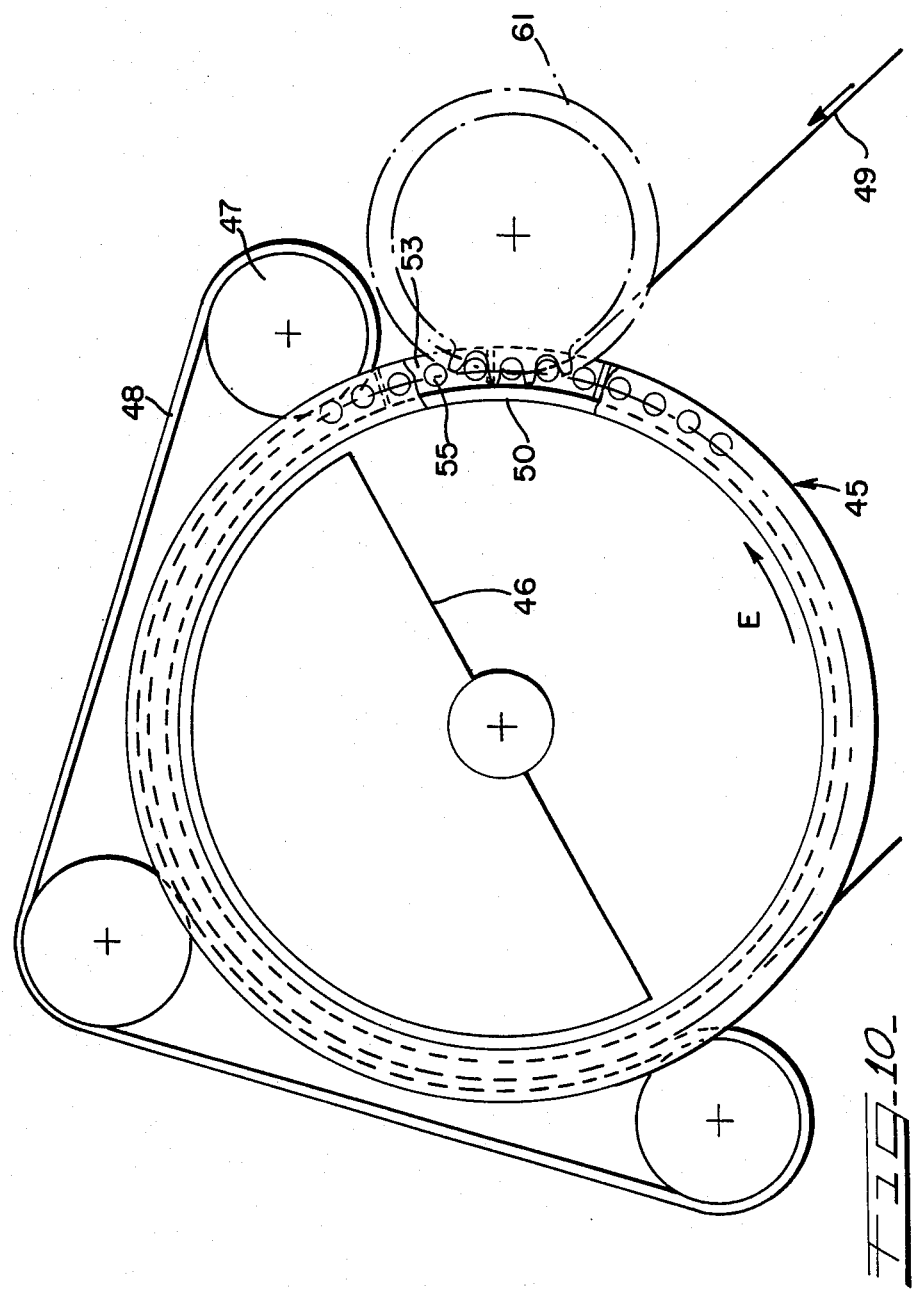

FIG. 10 is partly a schematic elevational view and partly a sectional view of part of a third embodiment of a device in accordance with the invention.

Figure 11:
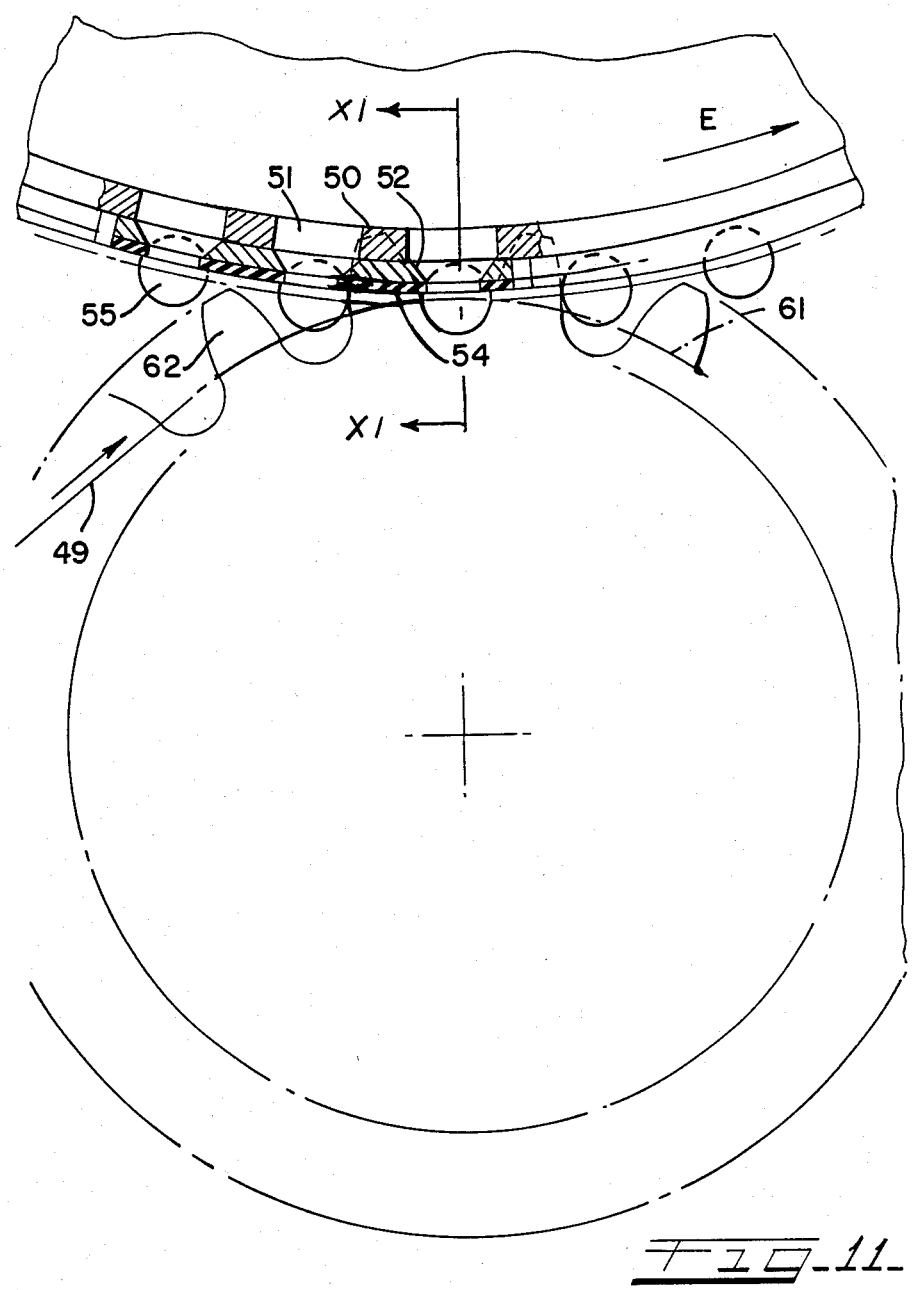

FIG. 11 shows on an enlarged scale part of the device of FIG. 10.

Figure 12:
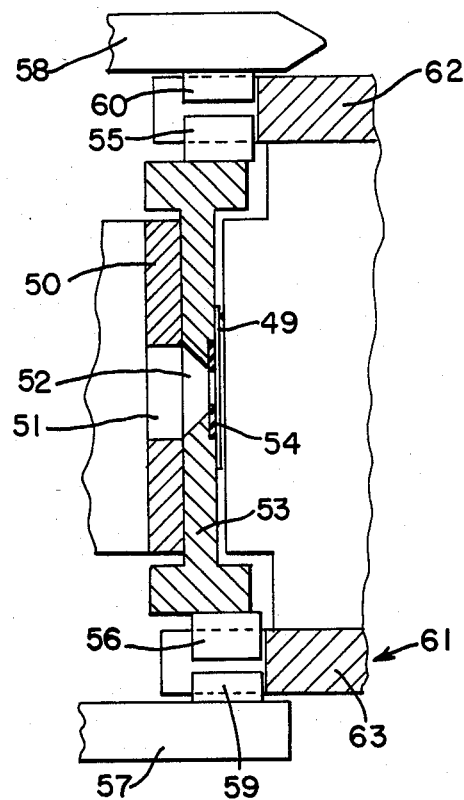

FIG. 12 is a sectional view of FIG. 11 taken on the line XI—XI in FIG. 11.

Referring to FIG. 1, a metal or metallized tape, which has to be locally provided with blot-shaped coverings, may be punched at given areas in an manner such that such a tape essentially consists of two peripheral parts 1 and 2 more or less continunously extending over the length of the tape and intermediate finger-shaped parts 3 and 4 and a rectangular part 5 enclosed by the free ends of the finger-shaped parts 3 and connected by two tie strips 6 and 7 with the peripheral parts 1 and 2. The parts 3 to 7 form a single product, which is punched together with a large number of identical parts out of the tape so that parts are still adhering to one another in order to subject them like a tape-shaped object to a plurality of treatments before the parts are separated from one another. One of these treatments may be the application of a blot-shaped covering to that parts of a product which are located in FIG. 1 in the rectangular frame bounded by the dot-and-dash line A.

A further specimen of a product to be treated by a device embodying the invention is shown on FIG. 2, in which contact sleeves 8 for pins are united with the aid of a ribbon-shaped member 8A to form a tape, whilst for example the rectangular surface outlined by the dot-and-dash line B of each contact member 8 has to be provided with a metal coating.

Such a metal coating may be applied with the aid of the device schematically shown in FIG. 3

This device comprises a wheel rotatable about a rotary axis 9 and arranged in a holder 10 provided near its underside with an outlet duct 11 for electrolyte 12 contained in the holder 10. Inside the wheel a spray body 13 is arranged so as to form an anode. Subsequent to exposure to any pretreatments a metal tape 14 to be worked serving as a cathode is fed in operation in the direction of the arrow C along a guide wheel 15, then along the outer periphery of the wheel 9 and subsequently along a guide wheel 16 and conducted away to be wound on a reel (not shown). During operation the wheel 9 rotates in a direction indicated by the arrow D.

In order to ensure satisfactory contact between the tape 14 to be treated and the outer periphery of the wheel 9 the device furthermore comprises a supporting belt 17, preferably of elastic, soft material, which is guided with the aid of guide wheels 18 in a manner such that this supporting belt holds the parts of the metal or metallized tape 14 covering a large arc around the wheel.

During operation electrolyte is supplied by pressure to the spray body 13 through a supply duct 19 communicating with the spray body 13.

The rotary axis of the wheel 9 may or may not be disposed horizontally or vertically.

FIGS. 4 to 6 show more in detail an embodiment of a wheel structure in accordance with the invention. It will be apparent that the wheel 9 comprises a disc 20 rotatable about the rotary axis of the wheel and provided at its circumference with a ring 21 of U-shaped section having unequal limbs. At a given distance from the disc 20 the wheel 9 is provided with a ring 22 rigidly secured to the disc 20 and the ring 21 and bounding a groove opening towards the ring 21.

The grooves bounded by the rings 21 and 22 accommodate the rims of elongate, curved segments 23 of a hard synthetic resin such as perspex. The measures are such that the segments 23 can expand in a tangential direction and/or, as the case be, to a limited extent displaceable with respect to the rings 21 and 22. The segments may be fixed in place near their centres with respect to the rings 21 and 22, whilst they can nevertheless freely expand or shrink relatively to one another. In the embodiment shown each segment 23 has three passages 24 having a shape such that away from the inner circumference of the segments the sectional area of the passage 24 gradually decreases to a form of the sectional area matching the shape of the blot-like coating to be applied to the tape. From FIG. 6 in particular it will be apparent that flexible sealing members 25 are arranged between successive segments 23. Moreover, each segment 23 is provided with an indexing pin 26 projecting above the outer surface of the segment concerned, which pin can co-operate during operation with a matching indexing recess in the metal or metallized tape to be treated.

When in operation a tape 14 to be treated is passed through the device, the indexing recess of the tape will engage an indexing pin 26 on a segment near the spot where the metal tape comes into contact with the outer periphery of the wheel 9 so that the tape is moved into the correct position relative to the segment concerned. During the movement of the tape part, which is correctly disposed and fixed with respect to the segment 23 concerned this segment and this tape part will maintain their desired relative positions independently of movements caused, for example, by expansion of other tape parts and/or displacement and/or expansion of other segments.

During the displacement of the tape part concerned along the wheel it will maintain its correct position with respect to the associated segment so that discrepancies due to differences of expansion and/or manufacturing tolerances and the like can be effectively balanced out and the desired blot-shaped coatings can be applied very accurately to the desired places on the tape. Without any objection the tape can be guided through a large arc along the periphery of the wheel so that the electrolyte or spraying of the tape can be effective along a large arc, it thus being possible to displace the tape at a higher rate through the device without adversely affecting the quality of the final product. It is furthermore possible to use a wheel of proportionally larger diameter, whilst the tape is maintained along a large arc at the periphery of the wheel without resulting in problems due to expansion discrepancies of the material of the tape and of parts of the wheel.

In order to minimize discrepancies due to different expansion coefficients of the tape material and of the wheel material, the annular parts 21 and 22 may be made from metal for absorbing deviations resulting from expansions of the wheel in a radial sense. The metal parts will be provided with an insulating coating of synthetic resin. As an alternative, the various parts of the wheel may be made from a synthetic resin.

The sealing members 25 of elastic material, for example, rubber not only allow a tangential movement of the segments 23 with respect to the further part of the wheel 9, but also provide a fluid seal between the consecutive segments so that fluid sprayed by the body 13 is prevented from leaking away between consecutive segments and from undesirably coming into contact with the tape surface which engages the outer peripheries of the segments 23 and which has to be provided with blot-shaped coatings only in the areas of the recesses 24.

In the embodiment shown in FIGS. 7 to 9 a tape 27 to be provided with blot-shaped coatings is guided in a manner similar to that described with reference to the first embodiment with the aid of guide wheels 28 around the outer periphery of a wheel 29 so that the side of the tape to be provided with blot-shaped coverings is again in contact with the outer periphery of the wheel 29. As is shown in FIGS. 8 and 9, the wheel comprises two L-section rings 30 and 31 supported by three rollers 32, 33 and 34. Near the ends the rollers have grooves 35 receiving the outer rims of the rings 30 and 31 as is illustrated in FIGS. 8 and 9. The distance between the two grooves in the roller 32 is smaller than the distance between the corresponding grooves in the rollers 33 and 34, so the ringes 30 and 31 include small angles with a plane extending perpendicular to the axis of the rotation of the wheel 29. Side walls of the grooves are bevelled in accordance with the inclined position of said rings.

Like in the preceding embodiments supporting belt 36 may be used and be guided with the aid of the rollers 32 to 34 together with the tape 27 around the outer periphery of the wheel 29. For guiding the belt the rollers 32 to 34 are provided with uninterrupted ridges 37.

Between the L-section rings 30 and 31 segments 38 forming the outer periphery of the wheel and corresponding with the segments of the first embodiment are provided with passages 39. Each segment 39 furthermore has an indexing pin 40. As is shown in FIGS. 8 and 9 a pin 41 and 42 is provided on each side of a segment 38 so that these pins are in line with one another and extend parallel to the rotary axis of the wheel. The pins 41 and 42 are received in holes 43 and 44 respectively in the flanges in the L-section rings 30 and 31. The sectional area of each hole 43 and 44 respectively gradually diminishes from the end of the hole facing the segment concerned towards the end of the hole remote from said segment.

Owing to the mode of guiding described above for the rings 30 and 31 of the wheel 29 with the aid of the grooves 35 in the guide rollers 32 to 34 the distance between the rings 30 and 31 at the area of the roller 32, where the tape 27 is fed to the periphery of the wheel, is such that the rings 30 and 31 are as near as possible one another and the pins 41 and 42 are supported by wall parts of the holes 43 and 44 concerned in a manner such that radial displacement of said pins in the holes is excluded. Consequently the location of a segment 38 supported by the pins concerned is accurately fixed with respect to the further part of the wheel 29 and since the location of a segment 38 is accurately determined a tape part is positioned with the aid of the indexing pin 40 with respect to said segment and fixed in place because the indexing pin 40 of said snaps into the associated indexing recess of the tape 27.

Upon a further turn of the wheel 29 the rings 30 and 31 gradually move slightly away from one another so that the pins 41 and 42 of the segment concerned have a given amount of play in the holes 43 and 44 so that the segments obtain a given freedom of movement in the tangential direction with respect to the further parts of the wheel, whereas nevertheless the correct location of the segments relative to the associated parts of the tape is maintained during the electro-plating process of the tape 27 moving around the wheel 29. It will thus be obvious that this embodiment has the same advantages as the first embodiment. The relative seal between consecutive segments can be achieved in a manner similar to that described above. For sealing the segments relative to one another, they may, as an alternative, be provided with a plurality of protruding tags meshing with one another without adversely affecting the tangential displaceability of the segments, said tags constituting a kind of labyrinthine seal between the consecutive segments.

FIGS. 10 to 12 schematically show a third embodiment of a device in accordance with the invention. This device also comprises a wheel 45, in which a spray body 46 is arranged. There is furthermore provided an endless supporting belt 48 guided along guide wheels 47 for supporting the metal or metallized tape 49 to be provided with blot-shaped coverings on the side remote from the wheel. In this embodiment the wheel is provided with an uninterrupted rim 50 having bores 51 at the desired distances from one another. The outer periphery of the wheel is provided with I-section segments 53 having bores 52 opposite the bores 51. In this embodiment flexible sealing members 54 are arranged in the area of the bores 52 in the outer peripheries of the segments, against which members the tape 49 to be worked is pressed. On each side of a segment 53 is arranged a pin 55 and 56 respectively so that the centre lines of the pins are parallel to the rotary axis of the wheel and in line with one another. The wheel 45 is provided with discs 57 and 58 rigidly connected with the rim 50 and disposed one on each side of the rim. On their proximal sides said discs are provided with equidistant pins 59 and 60 so that the centre lines of every two pins 59 and 60 are registering.

Near the point where the tape 49 to be provided with blot-shaped coverings contacts the outer periphery of the wheel 45 rotating in operation in the direction of the arrow E a guide wheel 61 is arranged for the tape. This guide wheel is provided on the sides with toothed rims 62 and 63 (FIG. 12) and indexing pins (not shown) co-operating with corresponding recesses in the tape 49. The wheel 61 is driven by the wheel 45 via the toothed rims 62 and 63 and the pins 59 and 60. During operation the teeth of the toothed rims 62 and 63 associated with the wheel 61 will engage, as will be apparent in particular from FIG. 12, both the pins 55 and 56 fastened to the segments 53 and the pins 59 and 60 fastened to the wheel, so that the teeth of the wheel 61 will direct two pins 59 and 60 with respect to the pins 55 and 56 fastened to a given segment 53 in a manner such that the centre lines of said pins get into line with one another. At the same time the location of the tape part 49 coming into contact at this place is determined by an indexing pin on the synchronizing wheel 61 and a recess cooperating herewith and provided in the tape 49. It will be obvious that at the area where the tape comes into contact with the outer periphery of the wheel 45 a given segment 53 is very accurately disposed with respect to a given tape part. Upon a further turn of the wheel 45 the teeth of the synchronizing wheel 61 will release the segment concerned. The disposition may be such that the friction coefficient between the tape 49 to be provided with blot-shaped coverings and the segment 53 exceeds the friction coefficient between the segment 53 and the rim 50 supporting said segment. As an alternative, this construction also permits of using indexing pins as described for the preceding embodiments. Consequently, during the further displacement of the tape along the outer periphery of the wheel for the electro-plating process the correct location of the segment 53 with respect to the associated tape part will be maintained, whilst a segment can shift in a tangential direction with respect to the further part of the wheel and hence to the other segments. Also this embodiment provides the same advantages as the embodiments described earlier. The seal between consecutive segments can again be achieved in the same manner as in the preceding embodiments.

It will be obvious that within the spirit and scope of the invention additions and/or modifications of the embodiments described above and illustrated in the Figures can be made. In these embodiments a wheel-shaped member is employed, since this will, in general, involve the simplest construction, whilst at the same time a satisfactory contact of the tape to be provided with the blot-shaped coverings can be established along a large arc. It may, however, be imagined to join the segments to form an endless belt guided along two wheels. The invention is furthermore not limited to the treatment of the products shown in FIGS. 1 and 2, since other tape-shaped products and/or differently shaped blot-like covering can be used.

Moreover, around the openings of, for example, the passages 24 or 39 sealing rings of flexible material can be arranged for co-operating with the tape to ensure an optimum seal.

As a matter of course, the device may also be constructed so that two or more tapes passed side by side through the device can be worked.

The figures used in the claims are only meant to explain more clearly the intention of the invention and are not supposed to be any restriction concerning the interpretation of the invention.

What is claimed:

1. A device for applying blot-shaped coverings to a metal or metallized tapes by electro-plating, comprising:
    a guide member along which a metal and/or metallized tape can be guided;
    an endless masking member co-operating with the tape and the guide member and having passages, the shapes of which match the desired blot-shaped coverings, said masking member being formed by independent segments, each of which having at least one passage;

sealing means being arranged between said segments, and the structure of said sealing means being such that while maintaining the sealing relationship between said segments, said segments move relative to one another in the direction of length of said masking member; and wherein said masking members form a periphery of a wheel.

2. A device for applying blot-shaped coverings to a metal or metallized tapes by electro-plating comprising:
   a guide member along which a metal and/or metallized tape can be guided;
   an endless masking member co-operating with the tape and the guide member and having passages, the shapes of which match the desired blot-shaped coverings, said masking member being formed by independent segments, each of which having at least one passage;
   sealing means being arranged between said segments, and the structure of said sealing means being such that while maintaining the sealing relationship between said segments, said segments move relative to one another in the direction of length of said masking member;
   wherein said segments are made from rigid material and are separated from one another with the aid of sealing strips forming said sealing means and said sealing strips being made from flexible material such as rubber; and
   wherein said masking members form a periphery of a wheel.

3. A device as claimed in claims 1, wherein said segments are provided with an indexing pin.

4. A device as claimed in claims 1, wherein the sides of said segments are locked in grooves in rings or discs which rings or discs form a part of a wheel, said rings or discs being located on both sides of said segments.

5. A device as claimed in claim 4, whereas said discs or rings are made from metal.

6. A device as claimed in claim 4, wherein said segments are provided with said indexing pin.

7. A device for applying blot-shaped coverings to metal or metallized tapes by electro-plating, comprising:
   a guide member along which a metal and/or metallized tape can be guided;
   an endless masking member co-operating with the tape and the guide member and having passages, the shapes of which match the desired blot-shaped coverings, said masking member being formed by independent segments, each of which having at least one passage; and
   sealing means being arranged between said segments, and the structure of said sealing means being such that while maintaining the sealing relationship between the segments, said segments move relative to one another in the direction of length of said masking member;
   the sides of said segments are provided with pins received in recesses in rings, said rings forming part of a wheel and being guided with the aid of guide members in a manner such that said rings are nearest one another at the point where the tape to be processed is fed to a periphery of a wheel and said rings are gradually moved away from each other and the tape is processed beyond said point, such that the sectional area of the recesses receiving the pins gradually increases from the outer side of the wheel towards the interior.

8. A device as claimed in claim 7 wherein said masking members form said periphery of the wheel.

9. A device as claimed in claim 7 wherein said segments are made from rigid material and are separated from one another with the aid of sealing strips forming said sealing means and said sealing strips being made from flexible material such as rubber.

10. A device as claimed in claim 9 wherein said masking members form said periphery of the wheel.

11. A device as claimed in claims 7, 8, 9 or 10 wherein said segments are provided with an indexing pin.

12. A device for applying blot-shaped coverings to metal or metallized tapes by electro-plating, comprising:
   a guide member along which a metal and/or metallized tape can be guided;
   an endless masking member co-operating with the tape and the guide member and having passages, the shape of which match the desired blot-shaped coverings, said masking member being formed by independent segments, each of which having at least one passage;
   sealing means being arranged between said segments, and the structure of said sealing means being such that while maintaining the sealing relationship between said segments, said segments move relative to one another in the direction of length of said masking member; and
   a first pin provided on at least one side of said segments and a second pin is provided on discs, said disc forming a part of a wheel, and a synchronizing wheel acting on said first and second pins is arranged near the place where the tape is fed to a periphery of the wheel for aligning said first and second pins to one another.

13. A device as claimed in claim 12 wherein said masking members form said periphery of the wheel.

14. A device as claimed in claim 12 wherein said segments are made from rigid material and are separated from one another with the aid of sealing strips forming said sealing means and said sealing strips being made from flexible materials such as rubber.

15. A device as claimed in claim 14 wherein said masking members form said periphery of the wheel.

* * * * *